(12) United States Patent
Weng

(10) Patent No.: US 6,968,493 B1
(45) Date of Patent: Nov. 22, 2005

(54) RANDOMIZER SYSTEMS FOR PRODUCING MULTIPLE-SYMBOL RANDOMIZING SEQUENCES

(75) Inventor: Lih-Jyh Weng, Shrewsbury, MA (US)

(73) Assignee: Maxtor Corporation, Longmont, CO (US)

( * ) Notice: Subject to any disclaimer, the term of this patent is extended or adjusted under 35 U.S.C. 154(b) by 0 days.

(21) Appl. No.: 09/395,845

(22) Filed: Sep. 14, 1999

(51) Int. Cl.$^7$ ............................................. H03M 13/00
(52) U.S. Cl. ...................... 714/782; 714/789; 708/252; 708/492; 380/30
(58) Field of Search ................................ 714/728, 739, 714/761, 787, 788, 762, 789; 708/252, 492; 380/30

(56) References Cited

U.S. PATENT DOCUMENTS 5,796,776 A * 8/1998 Lomp et al. ................. 375/222
6,038,577 A * 3/2000 Burshtein .................... 708/252

OTHER PUBLICATIONS

Interlando, J.C. et al. 'On the decoding of Reed-Solomon and BCH codes over integer residue rings;' IEEE Transactions on Information Theory; May 1997;Vol.: 43 , Issue: 3;On page(s): 1013-1021.*

* cited by examiner

Primary Examiner—Guy J. Lamarre
(74) Attorney, Agent, or Firm—Cesari and McKenna, LLP

(57) ABSTRACT

A system that produces one or more non-repeating randomizer sequences of up to $2^m-1$ or more m-bit symbols includes a randomizer circuit that is set up in accordance with a polynomial with primitive elements of $GF(2^m)$ as coefficients. The system combines the randomizer sequence with all the symbols of ECC code words that are encoded using a BCH code over $GF(2^m)$ to produce a randomized code word. The particular primitive elements used and/or an initial state of one or more registers in the system specifies the particular sequence produced by the system. The initial state of each of the one or more registers is a selected one of the $2^m-1$ elements of $GF(2^m)$, and thus, $2^m-1$ different sequences may be produced by selecting a different initial state for a given one of the registers. If the coefficients are also selected from, for example, a set of "p" possible values, the system produces $p*(2^m-1)$ different sequences. The system may thus be used to encrypt the ECC code word by associating the code word with a particular selected initial state and/or coefficient. The coefficients may be selected to produce randomizer sequences that are predetermined minimum distances away from both the ECC code words.

16 Claims, 3 Drawing Sheets

RANDOMIZER SYSTEMS FOR PRODUCING MULTIPLE-SYMBOL RANDOMIZING SEQUENCES

BACKGROUND OF THE INVENTION

A randomizer sequence is a long, non-repeating sequence of symbols or bits that combine with a code word in order to randomize the code word symbols. One reason to randomize the symbols of the code word is to eliminate repeated patterns of symbols, such as patterns of all zero symbols, that may not always be accurately demodulated. The code words of interest are error correction code words that are produced by encoding data in accordance with an error correction code (ECC) over a Galois Field $GF(2^m)$. Over $GF(2^m)$, the sequence and the code word are combined by XOR'ing.

Before decoding, the randomizer sequence is removed from the randomized code word by combining the same sequence with the code word. The ECC code word can then be decoded in a conventional manner and errors in the code word data symbols corrected, as appropriate.

Randomizer circuits for producing multiple-bit non-repeating sequences are known. One such circuit is a binary maximal length linear feedback shift register, such as an m-bit shift register that produces a random sequence up to $2^m-1$ bits. The bit sequence, however, is not generally long enough to combine with all of the bits of the ECC code word. Accordingly, the $2^m-1$ bit sequence, or pattern, must be used multiple times in the same code word, and the randomizing of the code word symbols may be adversely affected.

SUMMARY OF THE INVENTION

The invention is a system that operates in accordance with one or more multiplier constants that are primitive elements of $GF(2^m)$ to produce multiple-symbol non-repeating randomizer sequences that are long enough to combine with all the symbols of ECC code words that are encoded over $GF(2^m)$. The randomizer sequence is thus used once in a given code word.

The system may, without rewiring, produce a number of different multiple-symbol randomizer sequences, such that a key may be needed to select the particular sequence used with a given code word. Accordingly, the system can be used also to encrypt the ECC code word. Further, the multiplier constants may be selected such that each randomizer sequence produced by the system is separated from every valid ECC code word by a predetermined minimum distance, as discussed in more detail below. The system can thus be used to provide mis-synchronization detection.

More specifically, the system includes a circuit that is set up in accordance with a polynomial with at least one coefficient, or multiplier constant, that is a primitive element of $GF(2^m)$, and produces a non-repeating sequence that includes $2^m-1$ or more m-bit symbols. The particular sequence produced by the circuit is determined by the primitive element selected as the multiplier constant and the selected initial state of one or more registers in the circuit. The initial state is selected such that at least one of the registers contains a non-zero element of $GF(2^m)$, and thus, $2^m-1$ different sequences may be produced by, for example, selecting a different initial state for the given register. If the primitive multiplier constant is also selected from, for example, a set of "p" possible multiplier constants, the system produces $p*(2^m-1)$ different sequences. If additional ones of the initial register states and/or the multiplier constants are selectable, the system may produce even greater numbers of sequences. Accordingly, the system may be used to encrypt the ECC code word by associating the code word with a particular initial state and/or multiplier constant. An unauthorized user would then have to try many possible multiple-symbol sequences, in order to remove the randomizer sequence from the randomized code word and reproduce the ECC code word.

The inventive system provides benefits that are not provided by the known prior randomizer systems. These prior systems produce relatively short random sequences that must be repeated in the code word and are thus not appropriate for encryption of the entire code word. Further, the prior systems produce sequences that are not necessarily optimized for mis-synchronization detection, that is, sequences that are not predetermined minimum distances away from the valid ECC code words. Accordingly, the known prior randomizing systems do not provide as robust mis-synchronization detection

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
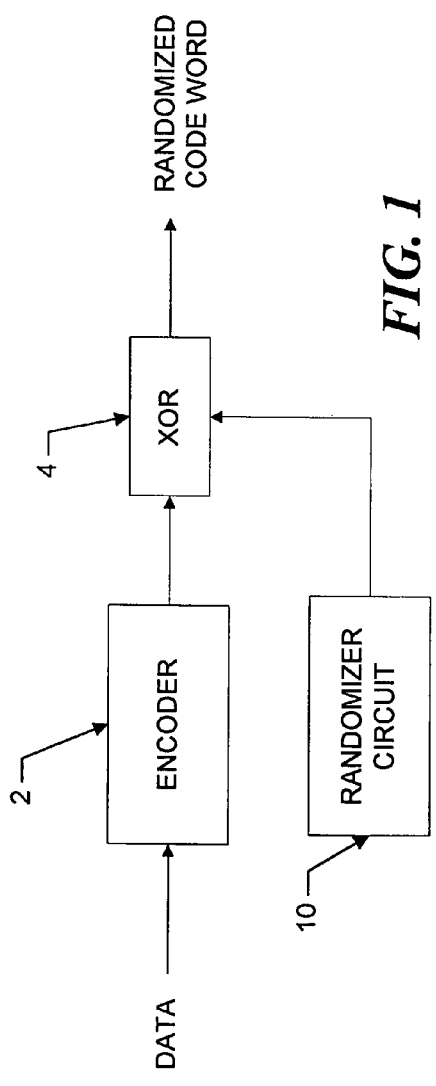
FIG. 1 is a functional block diagram of an encoding system constructed in accordance with the invention.

Referring to FIG. 1, an encoder 2 encodes data in a known manner in accordance with a BCH code, for example, a distance d Reed-Solomon code over $GF(2^m)$, to produce an ECC code word. At the same time a randomizer circuit 10 produces a multiple-symbol, non-repeating randomizer sequence. The symbols of the randomizer sequence are XOR'd to the corresponding symbols of the ECC code word in XOR gates 4, to produce a randomized code word for recording or transmitting.

Figure 2:
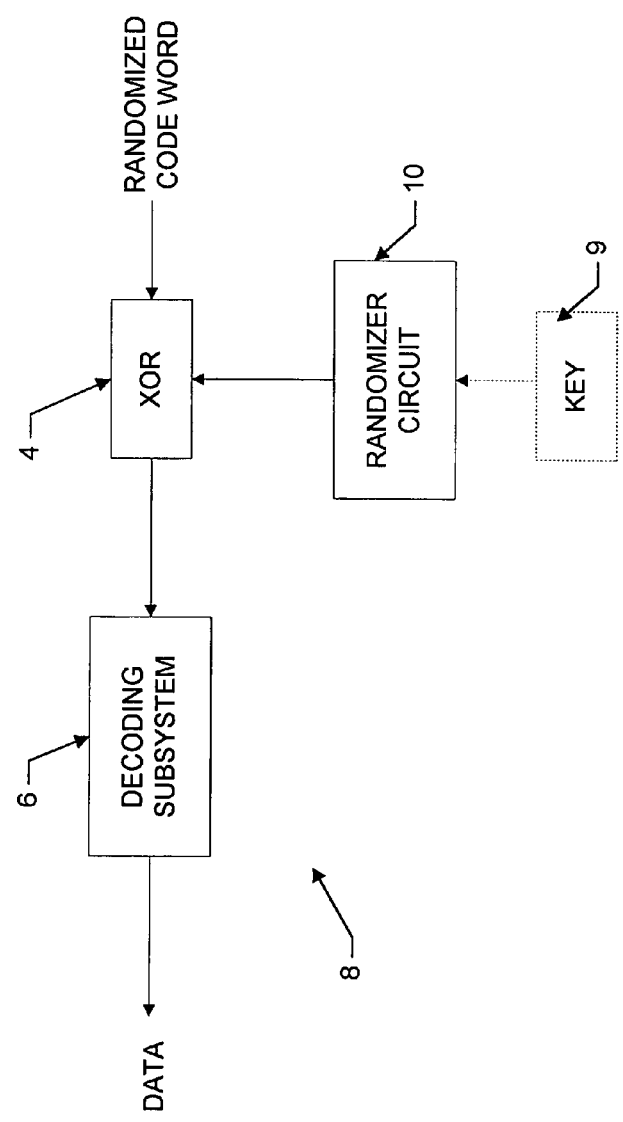
FIG. 2 is a functional block diagram of a decoding system constructed in accordance with the invention.

Referring now to FIG. 2, when the randomized code word is later retrieved or received, a decoder 8 removes the randomizer sequence from the code word in XOR gates 4, before the code word is decoded by a conventional decoding subsystem 6. Accordingly, the randomizer circuit 10 used for decoding must generate the same randomizer sequence produced by the encoder 2 (FIG. 1). If necessary, the decoder 8 uses information in a key 9 to set the randomizer circuit 10 to the appropriate initial state, as discussed below. The key 9 is provided to the decoder 8 in a conventional manner.

Figure 3:
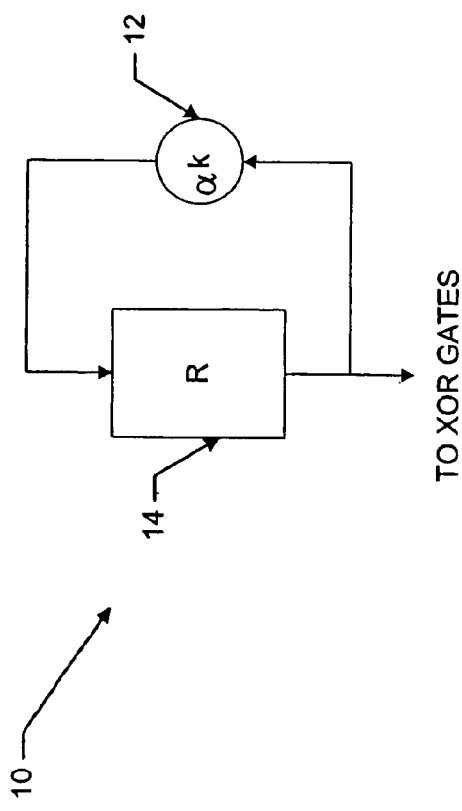
FIG. 3 is a more detailed functional block diagram of a randomizer circuit included in the systems of FIGS. 1 and 2.

Referring now to FIG. 3, a randomizer circuit 10 that is set up in accordance with a degree-one polynomial includes a multiplier 12, and a register 14 that is initially set to a non-zero element of $GF(2^m)$. The randomizer circuit depicted in the drawing generates a multiple-symbol randomizer sequence using the polynomial $x+\alpha^k$, where $\alpha^k$ is a primitive element of GF($2^m$). The sequence produced by the circuit is:

$$S_k = R\alpha^k, R(\alpha^k)^2, R(\alpha^k)^3 \ldots R(\alpha^k)^i$$

which is non-repeating for $i \leq 2^m - 1$. By selecting R as different ones of the $2^m - 1$ non-zero symbols of GF($2^m$), the system may produce $2^m - 1$ different, non-repeating randomizer sequences, with each sequence including up to $2^m - 1$ m-bit symbols. The system may store particular values for R or may generate them by, for example, raising $\alpha$ to a selected power.

The system must use the selected value of R to reproduce the same sequence for decoding. As appropriate, the key 9 specifies or points to the selected value of R or, for example, the selected power to which $\alpha$ is raised to produce R.

Figure 4:
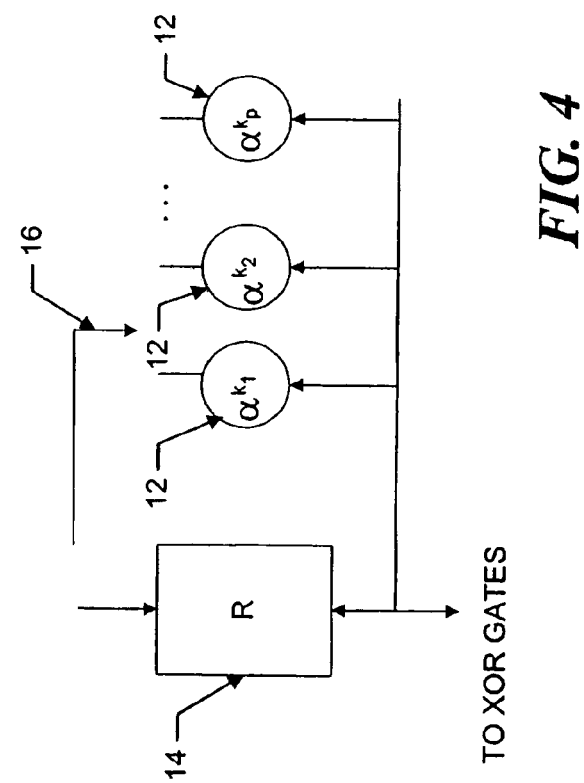
FIG. 4 is a functional block diagram of an alternative randomizer circuit.

For more robust encryption, the particular multiplier constant used to produce the randomizer sequence for a given code word may be selected from a set of "p" values. A general purpose multiplier (not shown) may then be used in the circuit 10 in place of the constant multiplier 12. Alternatively, as depicted in FIG. 4, p multipliers 12 may be included in the circuit, with a switch 16 selecting the particular multiplier to be used to produce the randomizer sequence for a given code word. The key supplied to the decoder must then include information that specifies both R and $\alpha^k$. If the key is not provided, a user must test a possible $p*(2^m - 1)$ sequences in order to remove the randomizer sequence from the randomized code word.

To provide mis-synchronization detection, the multiplier constant $\alpha^k$ may be selected to produce a randomizer sequence $S_k$ that is a predetermined minimum distance away from every code word of the distance d Reed-Solomon code such that a mis-synchronized error results in a decoded code word that contains more errors than the ECC can correct.

As discussed above, the multiplier constant may be selected from a set of p values. For mis-synchronization detection, the values in the set must each produce sequences that satisfy the predetermined minimum distance requirements. Generally, if $\alpha^k$ produces a randomizer sequence that meets the predetermined minimum distance requirements, $\alpha^{2k}, \alpha^{4k}, \alpha^{8k}, \ldots \alpha^{2^m k}$ also produces such a randomizer sequence. Accordingly, the p multiplier constants can be determined from tested $$\frac{p}{m}$$

values of $\alpha_k$.

Figure 5:
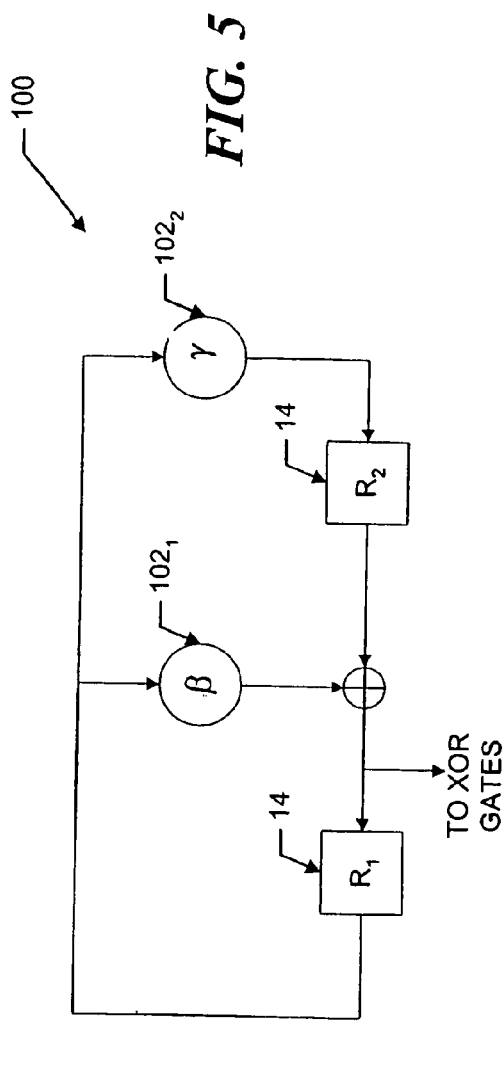
FIGS. 5 and 6 are functional block diagrams of further randomizer circuits.

Referring now to FIG. 5, circuits that use polynomials with degrees greater than one may also be used to produce longer multiple-symbol, non-repeating randomizer sequences. The higher-degree randomizer circuits produce sequences of up to $(2^m)^y - 1$ symbols, where y is the degree of the polynomial. These circuits may thus be used in systems in which the ECC is a primitive BCH code of degree y.

The drawing depicts a randomizer circuit 100 that is set up in accordance with a degree-two polynomial. The randomizer circuit 100 shown in the drawing includes two multipliers $102_1$ and $102_2$ and produces the randomizer sequence in accordance with the polynomial $x^2 + \beta x + \gamma$, where $\beta$ and $\gamma$ are primitive elements of GF($2^m$). For any pair of primitive elements $\beta$ and $\gamma$ the randomizer sequence produced by the randomizer circuit 100 is specified by $R_1$ and $R_2$, which may be, respectively, any elements of GF($2^m$), where at least one of $R_1$ and $R_2$ is non-zero. There are thus many more possibilities for the randomizer sequences with this system since the values of $\beta$, $\gamma$, $R_1$ and $R_2$ may each be selected and the randomizer circuit 100 may thus provide more robust encryption than the system depicted in FIG. 1. The key that is supplied for decoding must specify the selected values, so that randomizer system can be set to the appropriate initial state to reproduce the randomizing sequence.

For mis-synchronization detection, the values of the multiplier constants and at least one of the values for the register are preferably selected together, to ensure that associate randomizer sequence satisfies the predetermined minimum distance requirements. For each selection, there are $2^m - 1$ possibilities for the associated value of the remaining register, and thus, $2^m - 1$ possible sequences.

Figure 6:
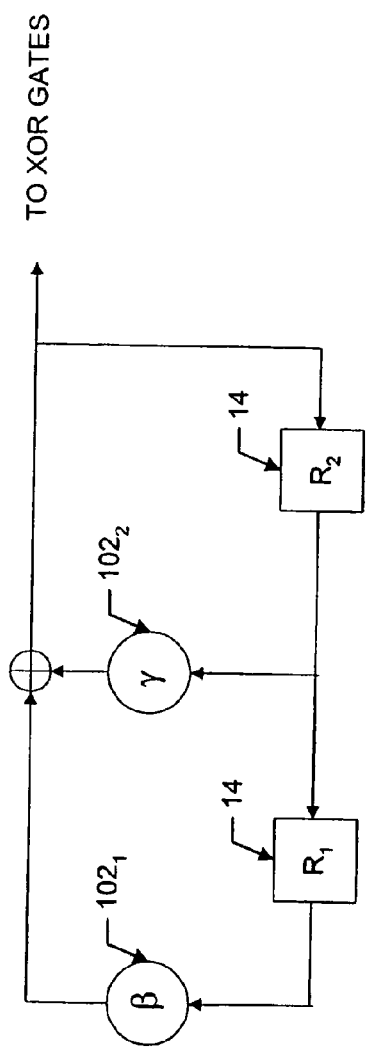

FIG. 6 depicts an alternative degree-two randomizer circuit 110. Again, the circuit produces multiple-symbol randomizer sequences for selected values of $\beta, \gamma$, $R_1$ and/or $R_2$.

The foregoing description has been limited to specific embodiments of this invention. It will be apparent, however, that variations and modifications may be made to the invention, with the attainment of some or all of its advantages. Therefore, it is the object of the appended claims to cover all such variations and modifications as come within the true spirit and scope of the invention.

What is claimed is:

1. A system for producing multiple-symbol non-repeating randomizer sequences over GF($2^m$), the system including:
   A. a first register for supplying an initial state, the register holding a non-zero element of GF($2^m$);
   B. a first multiplier for multiplying the contents of the register by a multiplier constant that is a primitive element of GF($2^m$); and
   C. first feedback means for
      i. supplying the products produced by the multiplier as the symbols of the randomizer sequence,
      ii. supplying the symbols of the randomizer sequence to update the first register, and
   D. encryption means for encrypting a code word, the encryption means including:
      i. selection means for selecting an initial state for use in producing the randomizer sequence;
      ii. means for combining the randomizer sequence with an ECC code word that is encoded in accordance with a given BCH code over GF($2^m$), the means producing a randomized code word; and
      iii. means for producing a key associated with the selected the initial state.

2. The system of claim 1 further including a decrypting subsystem for using the key to reproduce the randomizer sequence and removing the randomizer sequence from the randomized code word to reproduce the ECC code word.

3. The system of claim 2 further including means for detecting mis-synchronization, the mis-synchronization detection means including:
   a. means for combining the randomizer sequence with an ECC code word that is encoded in accordance with a given BCH code over GF($2^m$), the means producing a randomized code word;
   b. means for removing the randomizer sequence from the randomized code word to reproduce the ECC code word; and
   c. a decoder for decoding the reproduced ECC code word, the decoder detecting a mis-synchronization if the number of errors in the reproduced ECC code word is greater than the number of errors that can be corrected by the given BCH code.

4. A system for producing multiple-symbol non-repeating randomizer sequences over $GF(2^m)$, the system including:
   A. a first register for supplying an initial state, the register holding a non-zero element of $GF(2^m)$;
   B. a first multiplier for multiplying the contents of the register by a multiplier constant that is a primitive element of $GF(2^m)$ which is selected to produce randomizer sequences that are each a predetermined minimum distance from code words of a given BCH code; and
   C. first feedback means for
      i. supplying the products produced by the multiplier as the symbols of the randomizer sequence, and
      ii. supplying the symbols of the randomizer sequence to update the first register.

5. A system for producing multiple-symbol non-repeating randomizer sequences over $GF(2^m)$, the system including:
   A. a first register for supplying an initial state, the register holding a non-zero element of $GF(2^m)$;
   B. a first multiplier for multiplying the contents of the register by a multiplier constant that is a primitive element of $GF(2^m)$; and
   C. first feedback means for
      i. supplying the products produced by the multiplier as the symbols of the randomizer sequence, and
      ii. supplying the symbols of the randomizer sequence to update the first register,
   D. one or more second registers for holding elements of $GF(2^m)$;
   E. one or more second multipliers for multiplying the contents of the one or more second registers by one or more multiplier constants that are elements of $GF(2^m)$;
   F. an adder for adding the products produced by the first and second multipliers and supplying the sum to the first feedback means;
   G. second feedback means for supplying the contents of the first register to update the second register; and
   H. means for detecting mis-synchronization, the mis-synchronization detection means including:
      a. means for combining the randomizer sequence with an ECC code word that is encoded in accordance with a given BCH code over $GF(2^m)$, the means producing a randomized code word;
      b. means for removing the randomizer sequence from the randomized code word to reproduce the ECC code word; and
      c. a decoder for decoding the reproduced ECC code word, the decoder detecting a mis-synchronization if the number of errors in the reproduced ECC code word is greater than the number of errors that can be corrected by the given BCH code.

6. The system of claim 5 wherein the multiplier constants are further selected from a set of multiplier constants that produce randomizer sequences that are at least a predetermined minimum distance from code words of a given BCH code.

7. The system of claim 6 further including a means for providing a key to select the multiplier constants for a given the randomizer sequence.

8. A system for producing multiple-symbol non-repeating randomizer sequences over $GF(2^m)$, the system including:
   A. a first register for supplying an initial state, the register holding a non-zero element of $GF(2^m)$;
   B. a first multiplier for multiplying the contents of the register by a multiplier constant that is a primitive element of $GF(2^m)$; and
   C. first feedback means for
      i. supplying the products produced by the multiplier as the symbols of the randomizer sequence, and
      ii. supplying the symbols of the randomizer sequence to update the first register
   D. a plurality of second multipliers each for multiplying the contents of the register by a multiplier constant that is a primitive element of $GF(2^m)$;
   E. a switch for selecting one of the plurality of second multipliers or the first multiplier to produce the randomizer sequence; and
   F. encryption means for encrypting a code word, the encryption means including:
      i. selection means for selecting an initial state for use in producing the randomizer sequence;
      ii. means for combining the randomizer sequence with an ECC code word that is encoded in accordance with a given BCH code over $GF(2^m)$, the means producing a randomized code word; and
      iii. means for producing a key associated with the selected the initial state.

9. The system of claim 8 further including decryption means for using the key to reproduce the randomizer sequence and removing the randomizer sequence from the randomized code word to reproduce the ECC code word.

10. The system of claim 9 wherein the selection means further selects the multiplier constant from a set of multiplier constants.

11. A system for producing multiple-symbol non-repeating randomizer sequences over $GF(2^m)$, the system including:
    A. a first register for supplying an initial state, the register holding a non-zero element of $GF(2^m)$;
    B. a first multiplier for multiplying the contents of the register by a multiplier constant that is a primitive element of $GF(2^m)$; and
    C. first feedback means for
       i. supplying the products produced by the multiplier as the symbols of the randomizer sequence, and
       ii. supplying the symbols of the randomizer sequence to update the first register;
    D. one or more second registers for holding elements of $GF(2^m)$;
    E. one or more second multipliers for multiplying the contents of the first register by associated elements of $GF(2^m)$ and supplying the products to update the one or more second registers;
    F. one or more adders for adding the contents of the one or more second registers to the product produced by the first multiplier to produce a sum and supplying the sum to the first feedback means; and
    G. encryption means for encrypting a code word, the encryption means including:
       i. selection means for selecting an initial state for use in producing the randomizer sequence;
       ii. means for combining the randomizer sequence with an ECC code word that is encoded in accordance with a given BCH code over $GF(2^m)$, the means producing a randomized code word; and
       iii. means for producing a key associated with the selected the initial state.

12. A method for producing multiple-symbol non-repeating randomizer sequences over $GF(2^m)$, the method including the steps of:

A. supplying an initial state to a first register;
B. selecting a multiplier constant to produce randomizer sequences that are each a predetermined minimum distance from code words of a given BCH code and producing a first product by multiplying the contents of the first register by the multiplier constant that is a primitive element of $GF(2^m)$;
C. supplying the first product as
   a. a next symbol of the randomizer sequence, and
   b. an update to the first register;
D. repeating steps A–C i times for $i \leq 2^m-2$; and
E. detecting mis-synchronization by
   a. combining the randomizer sequence with an ECC code word that is encoded in accordance with a given BCH code over $GF(2^m)$, to produce a randomized code word;
   b. removing the randomizer sequence from the randomized code word to reproduce the ECC code word; and
   c. decoding the reproduced ECC code word and detecting a mis-synchronization if the number of errors in the reproduced ECC code word is greater than the number of errors that can be corrected by the given BCH code.

13. A method for producing multiple-symbol non-repeating randomizer sequences over $GF(2^m)$, the method including the steps of:
A. supplying an initial state to a first register;
B. selecting a multiplier constant to produce randomizer sequences that are each a predetermined minimum distance from code words of a given BCH code and producing a first product by multiplying the contents of the first register by the multiplier constant that is a primitive element of $GF(2^m)$;
C. supplying the first product as
   a. a next symbol of the randomizer sequence, and
   b. an update to the first register;
D. repeating steps A–C i times for $i \leq 2^m-2$; and
E. providing a key to select the multiplier constants associated with a given randomizer sequence.

14. A method for producing multiple-symbol non-repeating randomizer sequences over $GF(2^m)$, the method including the steps of:
A. supplying an initial state to a first register;
B. producing a first product by multiplying the contents of the first register by a multiplier constant that is a primitive element of $GF(2^m)$;
C. supplying the first product as
   a. a next symbol of the randomizer sequence, and
   b. an update to the first register;
D. repeating steps A–C i times for $i \leq 2^m-2$; and
E. encrypting a code word by:
   a. selecting an initial state for use in producing the randomizer sequence;
   b. combining the randomizer sequence with an ECC code word that is encoded in accordance with a given BCH code over $GF(2^m)$ to produce a randomized code word; and
   c. producing a key associated with the selected the initial state.

15. The method of claim 14 further including a step of decrypting the code word by using the key to reproduce the randomizer sequence and removing the randomizer sequence from the randomized code word to reproduce the ECC code word.

16. The method of claim 14 wherein the step of selecting the initial state further includes selecting one or more multiplier constants.

* * * * *